US009407221B2

United States Patent
Itakura et al.

(10) Patent No.: US 9,407,221 B2
(45) Date of Patent: Aug. 2, 2016

(54) DIFFERENTIAL AMPLIFIER CIRCUIT

(71) Applicant: Kabushiki Kaisha Toshiba, Minato-ku (JP)

(72) Inventors: Tetsuro Itakura, Nerima (JP); Masanori Furuta, Odawara (JP); Shunsuke Kimura, Kawasaki (JP); Go Kawata, Kawasaki (JP); Hideyuki Funaki, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/528,196

(22) Filed: Oct. 30, 2014

(65) Prior Publication Data

US 2015/0130538 A1    May 14, 2015

(30) Foreign Application Priority Data

Nov. 13, 2013   (JP) ................................ 2013-235311

(51) Int. Cl.
*H03F 3/45*  (2006.01)

(52) U.S. Cl.
CPC ........ *H03F 3/45183* (2013.01); *H03F 3/45188* (2013.01); *H03F 3/45475* (2013.01); *H03F 3/45654* (2013.01); *H03F 2203/45082* (2013.01); *H03F 2203/45084* (2013.01); *H03F 2203/45101* (2013.01); *H03F 2203/45352* (2013.01); *H03F 2203/45354* (2013.01); *H03F2203/45512* (2013.01); *H03F 2203/45528* (2013.01); *H03F 2203/45551* (2013.01)

(58) Field of Classification Search
CPC ....................................................... H03F 3/45
USPC .......................................... 330/253, 260, 258
See application file for complete search history.

(56) References Cited

U.S. PATENT DOCUMENTS

| 5,990,737 A | * | 11/1999 | Czarnul | H03F 3/45183 330/295 |
| 6,141,169 A | * | 10/2000 | Pietruszynski | H03F 3/45973 330/260 |

(Continued)

FOREIGN PATENT DOCUMENTS

| JP | 11-17466 | 1/1999 |
| JP | 2006-174033 | 6/2006 |

(Continued)

OTHER PUBLICATIONS

Yun Chiu et al. "A 14-b 12-MS/s CMOS Pipeline ADC With Over 100-dB SFDR", IEEE Journal of Solid-State Circuits, vol. 39, No. 12, 2004, 13 pages.

*Primary Examiner* — Patricia T Nguyen
(74) *Attorney, Agent, or Firm* — Oblon, McClelland, Maier & Neustadt, L.L.P

(57) ABSTRACT

In one embodiment, a differential amplifier circuit includes a first input terminal, a second input terminal, a first transistor, a second transistor, a third transistor, a current source, a first output terminal, a second output terminal, a first passive element, and a second passive element. The first (second) transistor has a control terminal connected to the first (second) input terminal. The third transistor has a control terminal. The control terminal is applied predetermined bias voltage. The current source is connected to a first terminal in each of the first transistor, second transistor, and third transistor. The first (second) output terminal is connected to a second terminal of the first (second) transistor. The first (second) passive element is connected between the first (second) input terminal and the first (second) output terminal.

7 Claims, 7 Drawing Sheets

(56) References Cited

U.S. PATENT DOCUMENTS

| | | | |
|---|---|---|---|
| 6,828,855 B1* | 12/2004 | Wang | H03F 1/308 330/253 |
| 7,414,468 B2 | 8/2008 | Yamaji et al. | |
| 8,988,267 B1 | 3/2015 | Kimura et al. | |
| 2003/0095006 A1* | 5/2003 | Ueno | H03F 3/211 330/258 |
| 2007/0024359 A1* | 2/2007 | Yamaji | H03F 3/193 330/69 |
| 2008/0068075 A1* | 3/2008 | D'Aquino | H03F 3/211 330/69 |
| 2012/0154048 A1* | 6/2012 | Myles | H03F 1/0205 330/260 |
| 2013/0135047 A1* | 5/2013 | Danioni | H03F 3/3022 330/252 |
| 2015/0085985 A1 | 3/2015 | Funaki et al. | |

FOREIGN PATENT DOCUMENTS

| | | |
|---|---|---|
| JP | 2007-43289 | 2/2007 |
| JP | 2011-205320 | 10/2011 |
| JP | 2015-65531 A | 4/2015 |
| JP | 2015-65532 A | 4/2015 |

* cited by examiner

DIFFERENTIAL AMPLIFIER CIRCUIT

CROSS REFERENCE TO RELATED APPLICATION(S)

This application is based upon and claims the benefit of priority from the prior Japanese Patent Application No. 2013-235311, filed on Nov. 13, 2013, the entire contents of which are incorporated herein by reference.

FIELD

Embodiments described herein relate generally to a differential amplifier circuit.

BACKGROUND

In a differential amplifier circuit of the related art, common-mode voltage (current) is detected from each output signal in order to set the common-mode voltage of the output signal, and the detected common-mode voltage (current) is fed back to the output signal. Therefore, in the differential amplifier circuit of the related art, there is a problem in which power consumption is increased in order to set the output common-mode voltage.

For instance, there is a proposed differential amplifier circuit in which the output common-mode voltage is set by detecting and feeding back input common-mode voltage. In this differential amplifier circuit, a separate amplifier circuit is necessary besides the differential amplifier circuit in order to compare the input common-mode voltage with the set voltage. Accordingly, extra power is consumed in the separate amplifier circuit.

Further, there is another differential amplifier proposed, in which three-input amplifier is used to set the input common-mode voltage. In this amplifier circuit, the input common-mode voltage can be set, but the output common-mode voltage cannot be set.

DETAILED DESCRIPTION

Embodiments will now be explained with reference to the accompanying drawings. The present invention is not limited to the embodiments.

In one embodiment, a differential amplifier circuit includes a first input terminal, a second input terminal, a first transistor, a second transistor, a third transistor, a current source, a first output terminal, a second output terminal, a first passive element, and a second passive element. The first transistor has a control terminal connected to the first input terminal. The second transistor has a control terminal connected to the second input terminal. The third transistor has a control terminal. The control terminal is applied predetermined bias voltage. The current source is connected to a first terminal in each of the first transistor, second transistor, and third transistor. The first output terminal is connected to a second terminal of the first transistor. The second output terminal is connected to a second terminal of the second transistor. The first passive element is connected between the first input terminal and the first output terminal. The second passive element is connected between the second input terminal and the second output terminal.

Embodiments of the present invention will be described below with reference to the drawings. In the following, a differential amplifier circuit formed of a MOS transistor will be described, but the differential amplifier circuit can be also formed of a bipolar transistor. The differential amplifier circuit can be formed of the bipolar transistor by substituting the MOS transistor described below with the bipolar transistor and further substituting a source terminal with an emitter terminal, a drain terminal with a collector terminal, and a gate terminal with a base terminal.

Further, in the following, an embodiment mainly using an N-channel MOS transistor will be described, but it is also possible to configure a differential amplifier circuit mainly using a P-channel MOS transistor or a PNP type bipolar transistor. The differential amplifier circuit mainly using the P-channel MOS transistor or the PNP type bipolar transistor can be formed by substituting the N-channel (P-channel) MOS transistor described below with the P-channel (N-channel) MOS transistor or with the PNP type (NPN type) bipolar transistor, and connecting a terminal connected to a ground (power source) to the power source (ground).

First Embodiment

Figure 1:
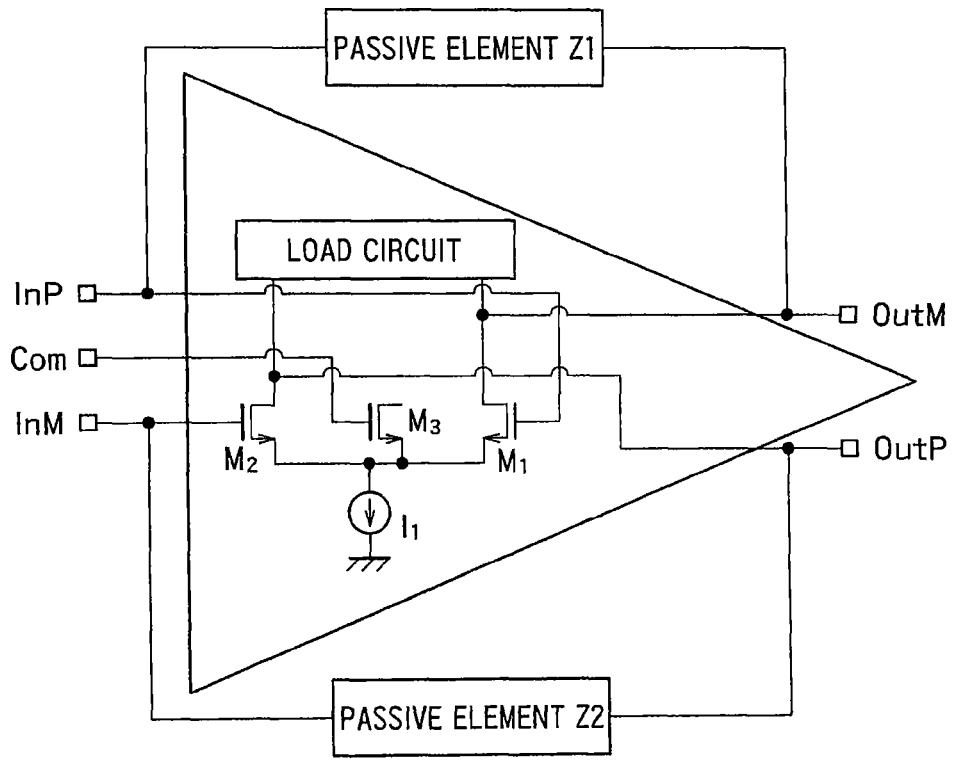
FIG. 1 is a diagram illustrating a differential amplifier circuit according to a first embodiment.

In the following, a differential amplifier circuit according to a first embodiment will be described with reference to FIGS. 1 to 4. Here, FIG. 1 is a diagram illustrating the differential amplifier circuit according to the first embodiment. This differential amplifier circuit respectively amplifies input signals differentially received from two input terminals and outputs the signals from output terminals. The common-mode voltage of the output signals output from the two output terminals is set at a predetermined value by reference voltage.

As illustrated in FIG. 1, the differential amplifier circuit includes an input terminal InP (first input terminal) and an input terminal InM (second input terminal), an output terminal OutM (first output terminal), an output terminal OutP (second output terminal), a transistor $M_1$ (first transistor), a transistor $M_2$ (second transistor), a transistor $M_3$ (third transistor), a current source $I_1$, a passive element $Z_1$ (first passive element), a passive element $Z_2$ (second passive element), and a load circuit.

The transistor $M_1$ is an N-channel MOS transistor (hereinafter referred to as "NMOS transistor"), having a gate terminal (control terminal) connected to the input terminal InP, a source terminal (first terminal) connected to the current source $I_1$, and a drain terminal (second terminal) connected to the output terminal OutM and the load circuit. The transistor $M_1$ is supplied with bias current $I_{M1}$ from the current source $I_1$.

The transistor $M_2$ is an NMOS transistor, having a gate terminal (control terminal) connected to the input terminal InM, a source terminal (first terminal) connected to the current source $I_1$, and a drain terminal (second terminal) connected to the output terminal OutP and the load circuit. The transistor $M_2$ is supplied with bias current $I_{M2}$ from the current source $I_1$. Further, as the transistor $M_2$, preferably a transistor having a device size same as the transistor $M_1$ is used.

The transistor $M_3$ is an NMOS transistor, having a gate terminal (control terminal) connected to the input terminal Com, and a source terminal (first terminal) connected to the current source $I_1$. The transistor $M_3$ has the gate terminal. The gate terminal of the transistor $M_3$ is applied predetermined reference voltage Vcom via the input terminal Com. The reference voltage Vcom is the voltage to set output common-mode voltage for the differential amplifier circuit. A drain terminal (second terminal) of the transistor $M_3$ is not illustrated, but is connected to a power source or the load circuit. The transistor $M_3$ is supplied with bias current $I_{M3}$ from the current source $I_1$. Meanwhile, as the transistor $M_3$, preferably a transistor having a device size smaller than the transistors $M_1$ and $M_2$ is used. With this configuration, power consumption used at the transistor $M_3$ in order to set the output common-mode voltage can be reduced.

The current source $I_1$ is connected between the source terminal of each of the transistors $M_1$, $M_2$, $M_3$ and the ground. The current source $I_1$ supplies the bias current $I_1$ ($I_1=I_{M1}+I_{M2}+I_{M3}$) to the transistors $M_1$, $M_2$ and $M_3$.

The passive element $Z_1$ is connected between the input terminal InP and the output terminal OutM. The output from the output terminal OutM is fed back to the input terminal InP via the passive element $Z_1$. Further, the passive element $Z_2$ is connected between the input terminal InM and the output terminal OutP. The output from the output terminal OutP is fed back to the input terminal InM via the passive element $Z_2$.

As the passive elements $Z_1$ and $Z_2$, resistance or capacitance may be used. In the case where the passive elements $Z_1$ and $Z_2$ are resistance, the differential amplifier circuit operates as a transimpedance amplifier. In the case where the passive elements $Z_1$ and $Z_2$ are capacitance, the differential amplifier circuit operates as an integrator.

The load circuit is a circuit to output input signals amplified by the transistors $M_1$ and $M_2$ as the voltage, and connected to the drain terminals of the transistors $M_1$ and $M_2$. Also, the drain terminal of the transistor $M_3$ may be connected to the load circuit, though not illustrated. As the load circuit, a current source supplying predetermined current to the transistors $M_1$ and $M_2$ may be used, for example.

Figure 2:
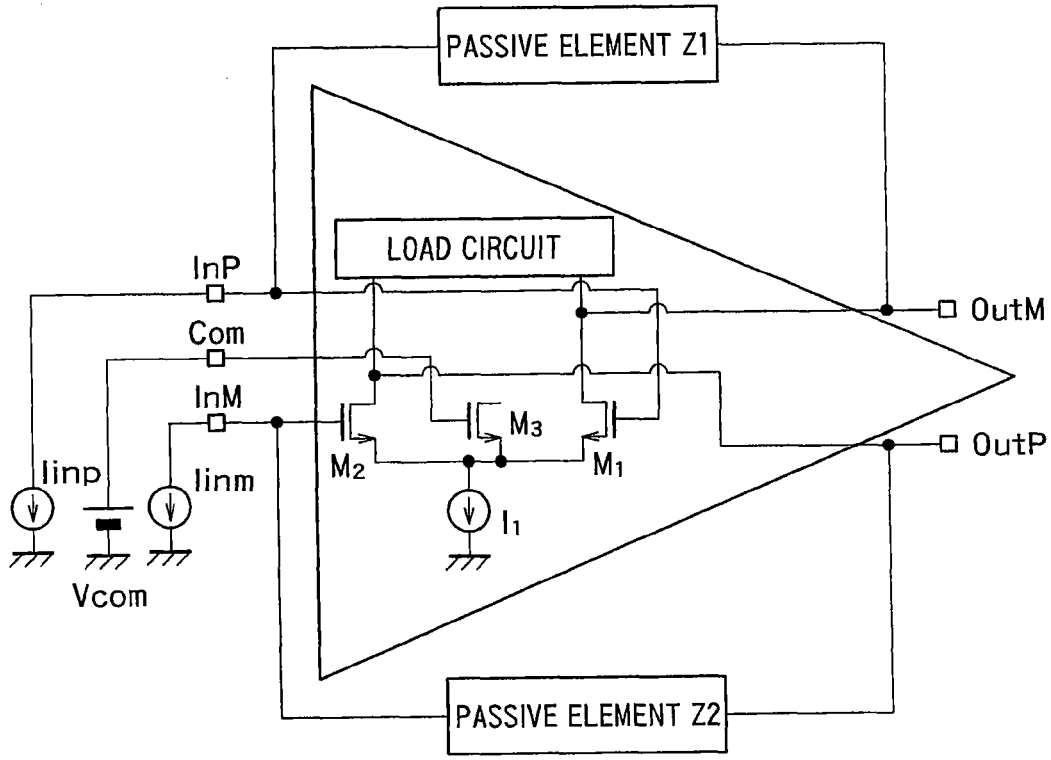
FIG. 2 is a diagram illustrating operation of the differential amplifier circuit in FIG. 1.

Next, operation according to the present embodiment will be described with reference to FIG. 2. As illustrated in FIG. 2, the differential amplifier circuit receives input signals Iinp and Iinm from the input terminals InP and InM and applied with the reference voltage Vcom from the input terminal Com. The input signal Iinp received from the input terminal InP is amplified to an output signal Voutm by a current-voltage converting gain determined at the passive element $Z_1$, and is output from the output terminal OutM. In the same manner, the input current Iinm received from the input terminal InM is amplified to an output voltage Voutp by a voltage-current converting gain determined at the passive element $Z_2$, and is output from the output terminal OutP. According to the present embodiment, the input terminals InP, InM, and Com are virtually short-circuited because negative feedback is applied by the passive elements $Z_1$ and $Z_2$. More specifically, the differential amplifier circuit compares the voltage Vinp and Vinm at the input terminals InP and InM with the voltage Vcom at the input terminal Com, and operates such that a difference therebetween becomes close to zero.

For instance, the voltage Vinp and Vinm at the input terminals InP and InM are lower than the reference voltage Vcom applied to the input terminal Com, current $I_{M3}$ flowing from the current source $I_1$ to the transistor $M_3$ is increased and the current $I_{M1}$ and current $I_{M2}$ flowing in the transistors $M_1$ and $M_2$ are decreased. Due to this, the voltage at the drain terminals at the transistors $M_1$ and $M_2$, namely, voltage Voutm and Voutp at the output terminals OutM and OutP become high, and the voltage Vinp and Vinm become close to the reference voltage Vcom.

In the same manner, the voltage Vinp and Vinm at the input terminals InP and InM are higher than the reference voltage Vcom applied to the input terminal Com, the current $I_{M3}$ flowing from the current source $I_1$ to the transistor $M_3$ is decreased and the current $I_{M1}$ and $I_{M2}$ flowing in the transistors $M_1$ and $M_2$ are increased. Due to this, the voltage at the drain terminals at the transistors $M_1$ and $M_2$, namely, the voltage Voutm and Voutp at the output terminals OutM and OutP become low and the voltage Vinp and Vinm become close to the reference voltage Vcom.

With the above-described operation of the differential amplifier circuit, the voltage Vinp and Vinm at the input terminals InP and InM become equal to the reference voltage Vcom (VinP=VinM=Vcom). The voltage Voutm and Voutp at the output terminals are: Voutm=Vinp+Iinp×$Z_1$ and Voutp=Vinm+Iinm×$Z_2$. Therefore, in the case of plugging Vinp=Vinm=Vcom into the above formula, the voltage at the output terminals become as next: Voutm=Vcom+Iinp×$Z_1$ and Voutm=Vcom+Iinm×$Z_2$.

Further, since the input signals Iinp and Iinm are differential signals, in the case where a bias component is Ib and a signal component is i, the input signals Iinp and Iinm become: Iinp=Ib+i, and Iinm=Ib−i. In the case of plugging these into the above-mentioned formulas, the voltage at the output terminals become: Voutm=Vcom+IbZ+iZ and Voutm=Vcom+IbZ−iZ. In other words, an output common mode component is Vcom+IbZ, and is set by the reference voltage Vcom.

As described above, according to the present embodiment, the output common-mode voltage can be set by applying the negative feedback with the passive elements $Z_1$ and $Z_2$ and applying the predetermined reference voltage Vcom to the input terminals InP and InM. Therefore, power consumption can be reduced because the output common-mode voltage can be set without detecting the output common-mode voltage from the output signal.

Figure 3:
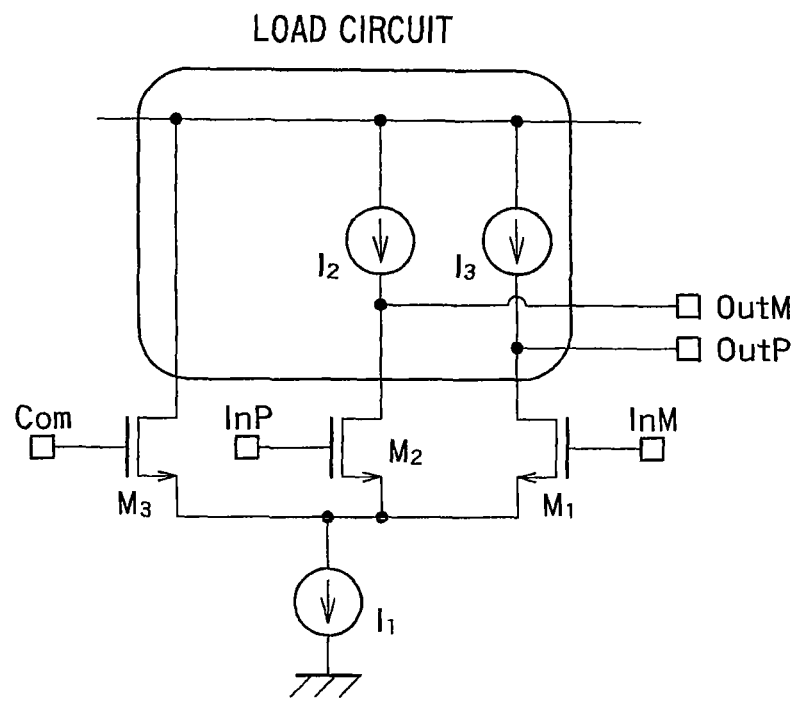
FIG. 3 is a diagram illustrating an exemplary load circuit in FIG. 1.

FIG. 3 is a diagram illustrating an exemplary load circuit according to the present embodiment. As illustrated in FIG. 3, the load circuit includes two current sources $I_2$ and $I_3$. The drain terminal of the transistor $M_1$ is connected to the current source $I_3$, the drain terminal of the transistor $M_2$ is connected to the current source $I_2$, the drain terminal of the transistor $M_3$ is connected to the power source. With this configuration, the input signals received from the input terminals InP and InM are amplified and can be output as the voltage.

Figure 4:
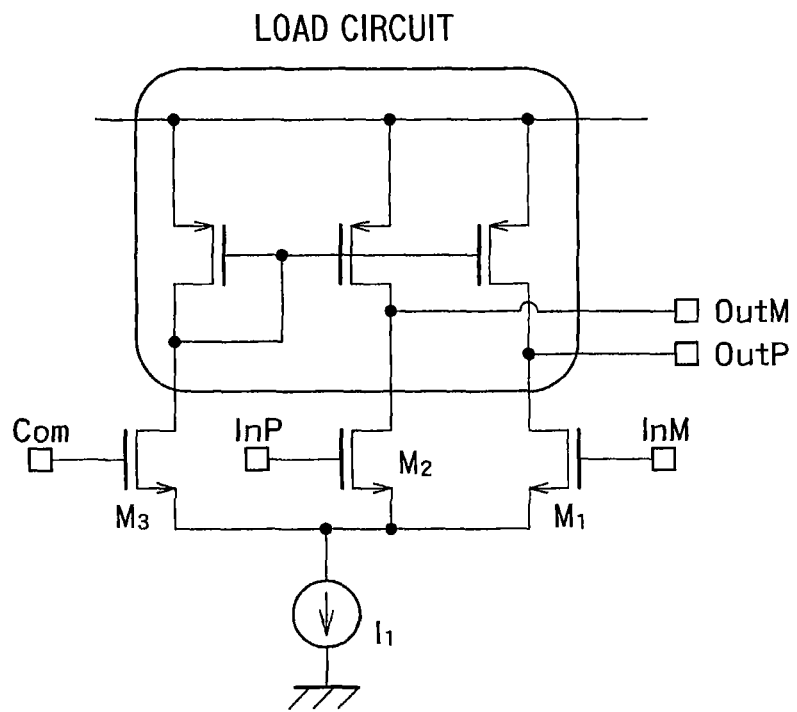
FIG. 4 is a diagram illustrating another exemplary load circuit in FIG. 1.

FIG. 4 is a diagram illustrating another exemplary load circuit according to the present embodiment. As illustrated in FIG. 4, the load circuit is formed of a current mirror circuit including three PMOS transistors having drain terminals connected to the drain terminals of the transistors $M_1$, $M_2$ and $M_3$. Preferably, a device size ratio of the three PMOS transistors is set same as the device size ratio of the transistors $M_1$, $M_2$ and $M_3$.

With this configuration, the drain current $I_{M3}$ of the transistor $M_3$ is reproduced at the current mirror circuit, and the reproduced current corresponding to a multiple of the device size ratio flows in the transistors $M_1$ and $M_2$. In this manner, a change of the drain current $I_{M3}$ in the transistor $M_3$, which has changed in accordance with a change of the voltage of the input terminals InP and InM, is transmitted to the respective transistors $M_1$ and $M_2$, and then fed back to the input terminals InP and InM via the passive elements $Z_1$ and $Z_2$. Therefore, a common-mode gain at the transistor $M_1$ and $M_2$ becomes large, and the voltage at the input terminals InP and InM can be more approximated to the reference voltage Vcom at the transistor $M_3$.

Second Embodiment

Figure 5:
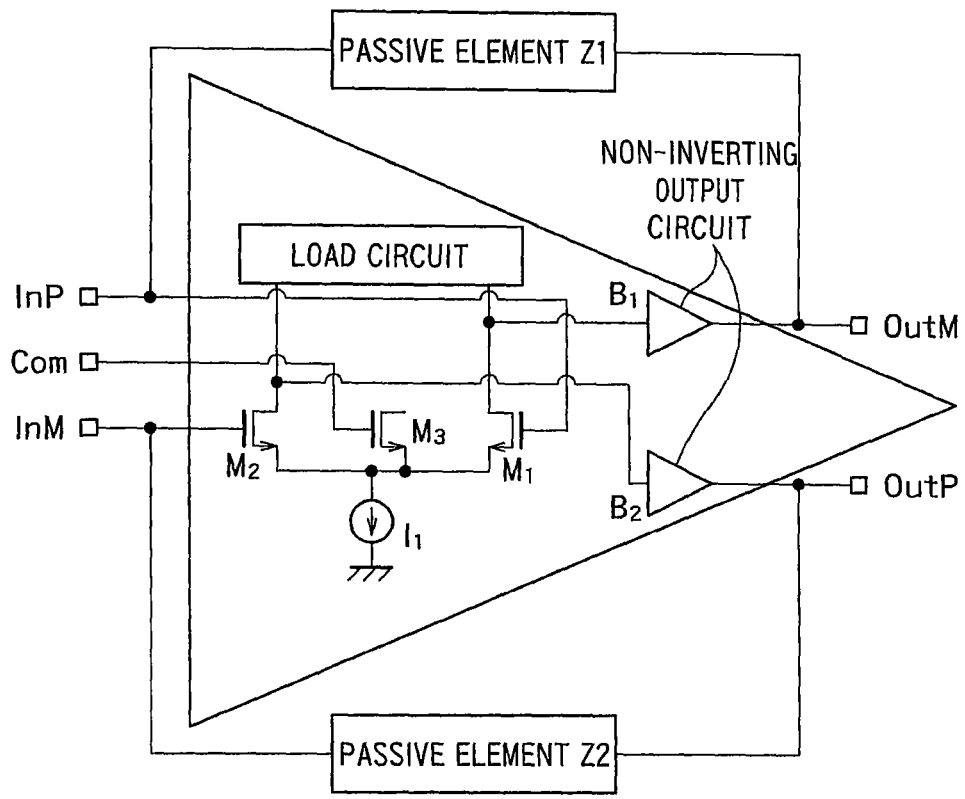
FIG. 5 is a diagram illustrating a differential amplifier circuit according to a second embodiment.

In the following, a differential amplifier circuit according to a second embodiment will be described with reference to FIGS. 5 to 8. Here, FIG. 5 is a diagram illustrating the differential amplifier circuit according to the second embodiment. As illustrated in FIG. 5, the differential amplifier circuit according to the present embodiment includes an input terminal InP, an input terminal InM, an output terminal OutM, an output terminal OutP, a transistor $M_1$, a transistor $M_2$, a transistor $M_3$, a current source $I_1$, a passive element $Z_1$, a passive element $Z_2$, and a load circuit. The configurations of the above components are same as a first embodiment, and therefore the description therefor will be omitted. The differential amplifier circuit further includes a non-inverting output circuit $B_1$ (first non-inverting output circuit) and a non-inverting output circuit $B_2$ (second non-inverting output circuit).

The non-inverting output circuits $B_1$ and $B_2$ are circuits that amplify an input signal by a predetermined gain and output the signal without phase inversion. The non-inverting output circuit $B_1$ is connected between a drain terminal of the transistor $M_1$ and the output terminal OutM, and the non-inverting output circuit $B_2$ is connected between a drain terminal of the transistor $M_2$ and the output terminal OutP. In the input terminals InP and InM, outputs from the non-inverting output circuits $B_1$ and $B_2$ are negatively fed back.

Figure 6:
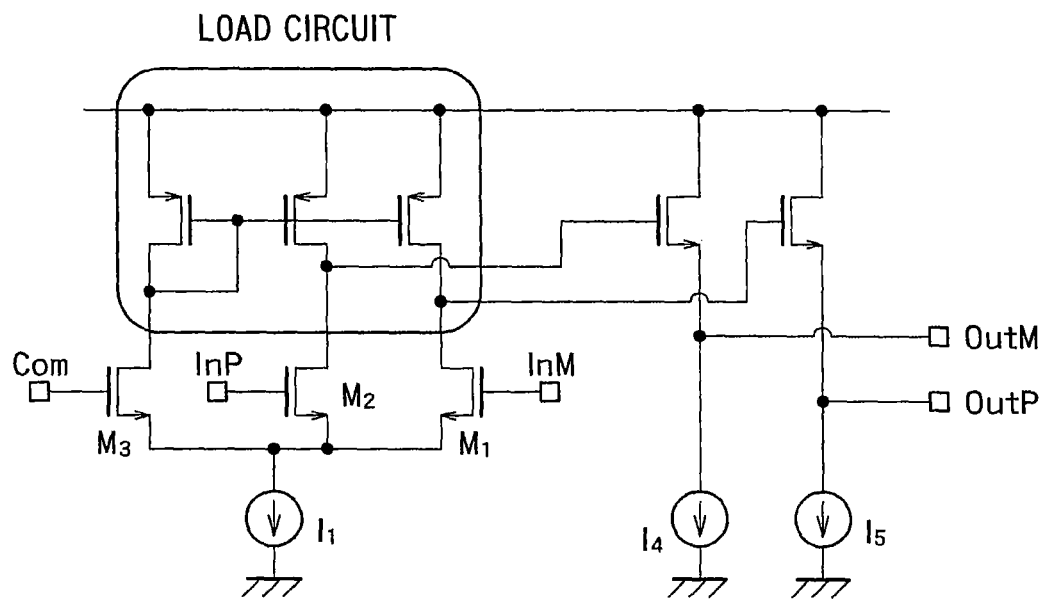
FIG. 6 is a diagram illustrating an exemplary non-inverting output circuit in FIG. 5.

FIG. 6 is a diagram illustrating an exemplary non-inverting output circuit according to the present embodiment. In FIG. 6, the differential amplifier circuit includes two source follower circuits as the two non-inverting output circuits. Each source follower circuit includes an NMOS transistor having a gate terminal connected to the drain terminal of the transistor $M_1$ ($M_2$), a drain terminal connected to a power source, and a source terminal connected to the output terminal OutM (OutP), and a current source $I_4$ ($I_5$) connected to the output terminal OutM (OutP). With this configuration, output impedance (output resistance) is decreased and current drive-capability is improved in the differential amplifier circuit. Therefore, larger load can be driven in a post-stage circuit of the differential amplifier circuit. Meanwhile, note that the configuration of the source follower circuit is not limited to the above-described configuration and can be optionally selected.

Figure 7:
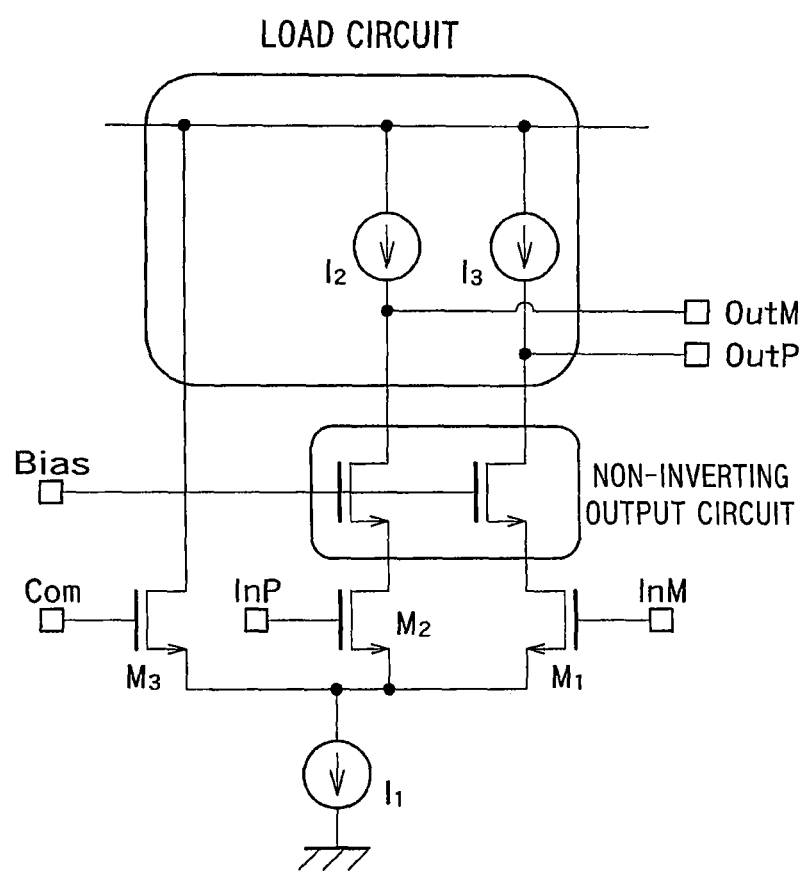
FIG. 7 is a diagram illustrating another exemplary non-inverting output circuit in FIG. 5.

FIG. 7 is a diagram illustrating another exemplary non-inverting output circuit according to the present embodiment. In FIG. 7, the differential amplifier circuit includes two common-gate circuits as two non-inverting output circuits. Each of the common-gate circuits includes an NMOS transistor having a drain terminal connected to the output terminal OutP (OutM), a source terminal connected to the drain terminal of the transistor $M_1$ ($M_2$), and a gate terminal from which bias voltage is applied. With this configuration, a differential gain and a common-mode gain at the differential amplifier circuit can be increased.

Figure 8:
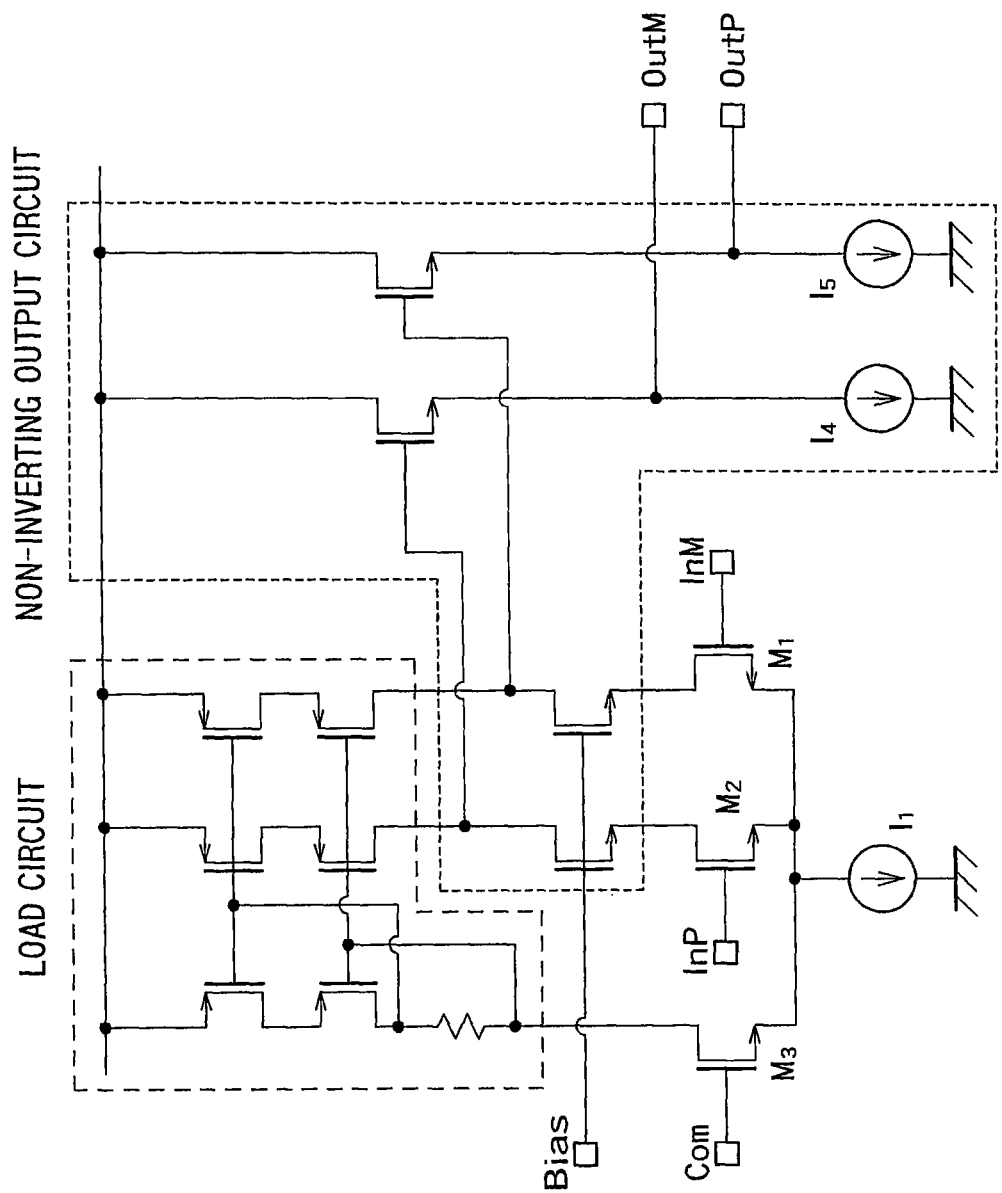
FIG. 8 is a diagram illustrating an example in which the non-inverting output circuits in FIGS. 6 and 7 are combined.

Additionally, as illustrated in FIG. 8, the differential amplifier circuit includes a current mirror circuit formed of a transistor cascode-connected as a load circuit, and further the common-gate circuit and the source follower circuit may be provided as the non-inverting output circuits. With this configuration, the common-mode gain and the differential gain at the differential amplifier circuit can be increased and also the current drive-capability can be improved.

Figure 9:
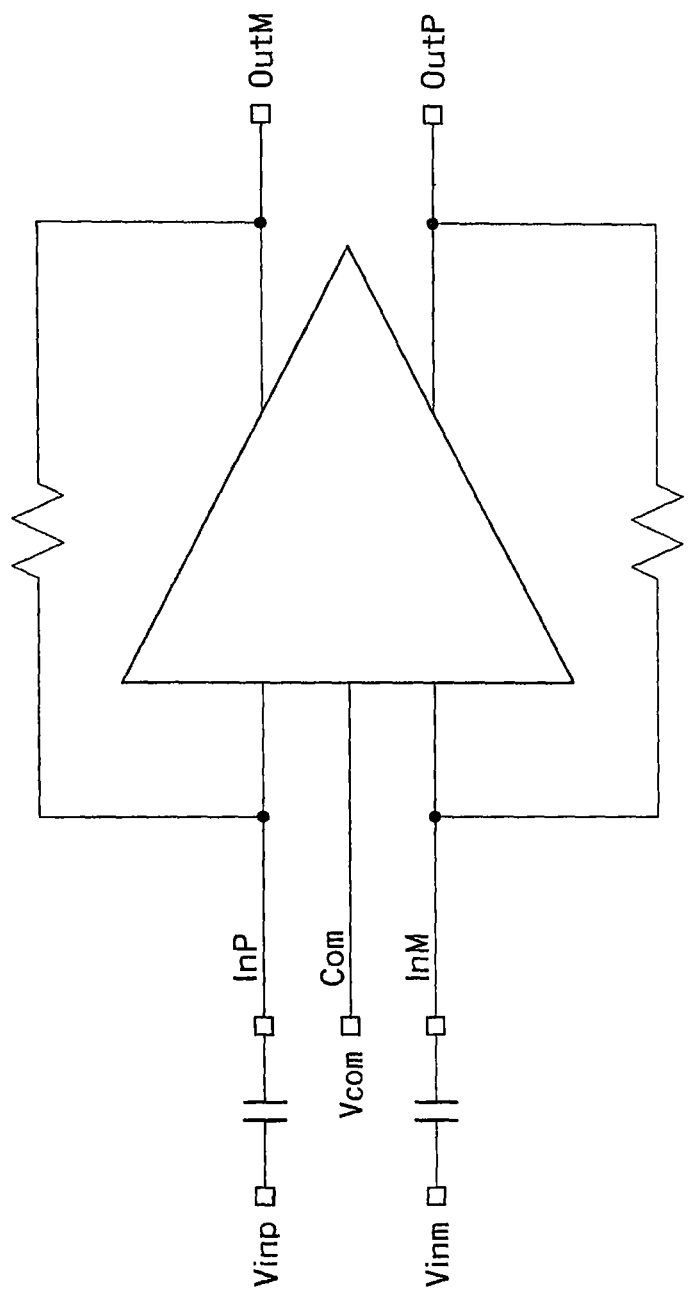
FIG. 9 is a diagram illustrating an exemplary differentiator including the differential amplifier circuit according to the first embodiment and the second embodiment.

FIG. 9 is a diagram illustrating an exemplary differentiator including differential amplifier circuit according to the above-described embodiments. This differentiator includes resistances as the passive elements $Z_1$ and $Z_2$, and the input terminals InP and InM are connected to capacitance. The input signals Vinp and Vinm are converted to the input signals Iinp and Iinm via the capacitance and received in the input terminals InP and InM. Voltage corresponding to a change rate of the input signals Vinp and Vinm are output from the output terminals OutM and OutP. The common-mode voltage of the output signals is set by the reference voltage Vcom.

Figure 10:
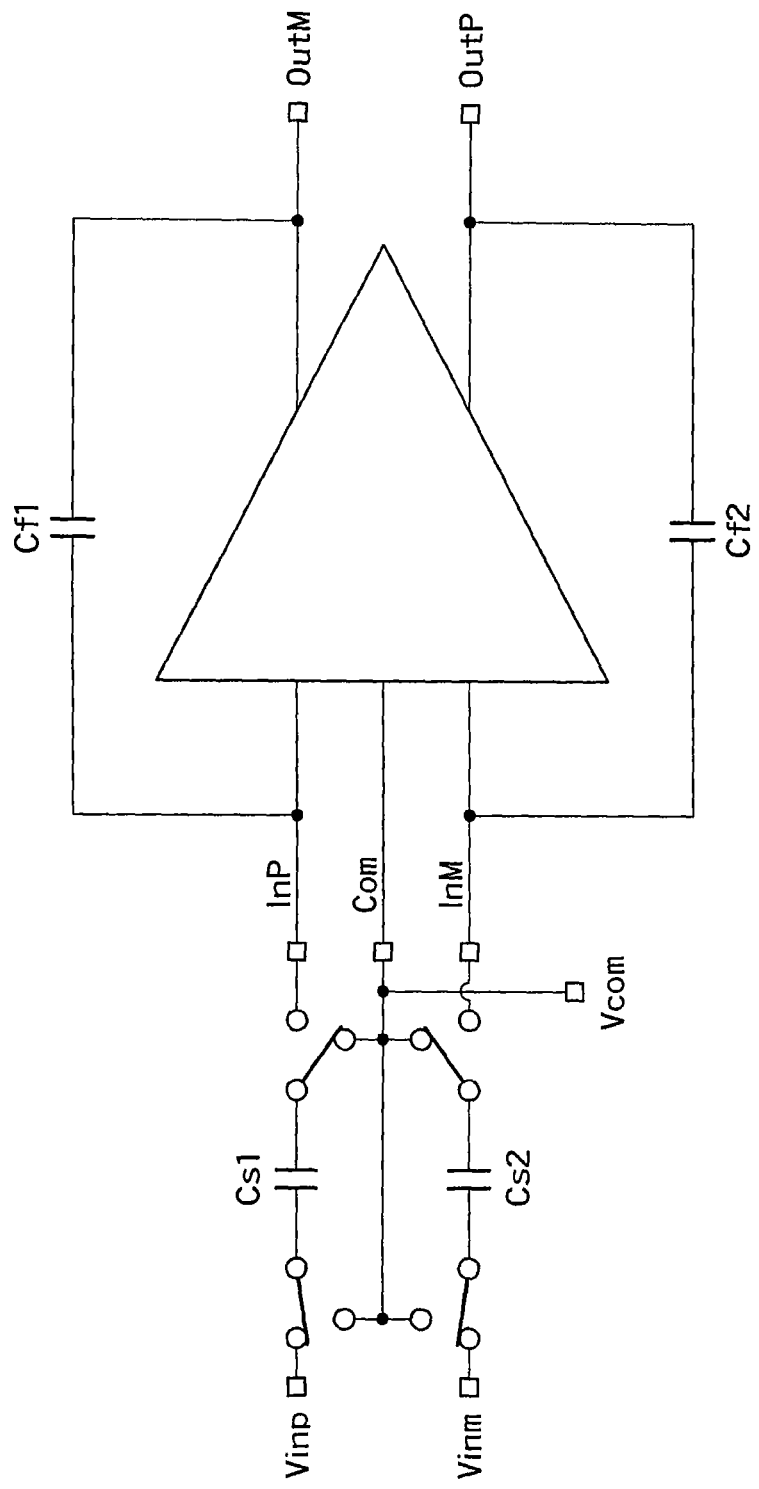
FIG. 10 is a diagram illustrating an exemplary integrator including the differential amplifier circuit according to the first embodiment and the second embodiment.

FIG. 10 is a diagram illustrating an exemplary integrator including the differential amplifier circuit according to the above-described embodiments. The integrator includes capacitance $Cf_1$ and $Cf_2$ as the passive elements $Z_1$ and $Z_2$, and the input terminals InP and InM are connected to a switched capacitor circuit including capacitance $Cs_1$, $Cs_2$ and switches. The input signals Vinp and Vinm are converted to the input signals Iinp and Iinm via the switched capacitor circuit, and received in the input terminals InP and InM. The switched capacitor circuit can switch a path at a predetermined time interval by using the switches. Voltage corresponding to an integrated value of the input signals Vinp and Vinm at a predetermined time interval is output from the output terminals OutM and OutP. The common-mode voltage of the output signal is set by the reference voltage Vcom.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A differential amplifier circuit, comprising:
   a first input terminal;
   a second input terminal;
   a first transistor having a control terminal connected to the first input terminal;
   a second transistor having a control terminal connected to the second input terminal;
   a third transistor having a control terminal applied predetermined bias voltage;
   a current source connected to a first terminal of each of the first transistor, the second transistor, and the third transistor;
   a first output terminal connected to a second terminal of the first transistor;
   a second output terminal connected to a second terminal of the second transistor;
   a first passive element connected between the first input terminal and the first output terminal;

a second passive element connected between the second input terminal and the second output terminal; and a load circuit connected to the second terminal of each of the first transistor and the second transistor;

wherein the load circuit is a current mirror circuit configured to copy current flowing in the third transistor and apply the current to the first transistor and the second transistor.

2. A differential amplifier circuit, comprising:

a first input terminal;

a second input terminal;

a first transistor having a control terminal connected to the first input terminal;

a second transistor having a control terminal connected to the second input terminal;

a third transistor having a control terminal applied predetermined bias voltage;

a current source connected to a first terminal of each of the first transistor, the second transistor, and the third transistor;

a first output terminal connected to a second terminal of the first transistor;

a second output terminal connected to a second terminal of the second transistor;

a first passive element connected between the first input terminal and the first output terminal;

a second passive element connected between the second input terminal and the second output terminal;

a first non-inverting output circuit provided between the second terminal of the first transistor and the first output terminal; and a second non-inverting output circuit provided between the second terminal of the second transistor and the second output terminal.

3. The differential amplifier circuit according to claim 2, wherein the first non-inverting output circuit and the second non-inverting output circuit are source follower circuits.

4. The differential amplifier circuit according to claim 2, comprising a load circuit connected to the second terminal of each of the first transistor and the second transistor.

5. The differential amplifier circuit according to claim 4, wherein the load circuit is a current mirror circuit configured to copy current flowing in the third transistor and apply the current to the first transistor and the second transistor.

6. The differential amplifier circuit according claim 1, wherein a device size of the third transistor is smaller than the device size of the first transistor and the second transistor.

7. The differential amplifier circuit according to claim 1, wherein the control terminal is a gate terminal or a base terminal, the first terminal is a source terminal or an emitter terminal, and the second terminal is a drain terminal or a collector terminal.

* * * * *